(12) United States Patent
Ichihara et al.

(10) Patent No.: US 8,391,048 B2
(45) Date of Patent: Mar. 5, 2013

(54) NON-VOLATILE SEMICONDUCTOR MEMORY DEVICE INCLUDING MEMORY CELLS WITH A VARIABLE RESISTOR

(75) Inventors: Reika Ichihara, Kangawa-ken (JP);
Takayuki Tsukamoto, Mie-ken (JP);
Kenichi Murooka, Mie-ken (JP);
Hirofumi Inoue, Kanagawa-ken (JP);
Hiroshi Kanno, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 12/846,198

(22) Filed: Jul. 29, 2010

(65) Prior Publication Data

US 2011/0032745 A1    Feb. 10, 2011

(30) Foreign Application Priority Data

Aug. 6, 2009    (JP) ................. 2009-183699

(51) Int. Cl.
*G11C 11/00* (2006.01)
(52) U.S. Cl. .............. 365/148; 365/189.09; 365/185.22; 365/226
(58) Field of Classification Search ............. 365/148, 365/189.09, 185.22, 158, 226
See application file for complete search history.

(56) References Cited

U.S. PATENT DOCUMENTS

| | | | | |
|---|---|---|---|---|
| 8,072,795 B1 * | 12/2011 | Wang et al. | ................. | 365/148 |
| 2007/0121388 A1 * | 5/2007 | Lee | ..................... | 365/185.29 |
| 2007/0195590 A1 * | 8/2007 | Sugita | ..................... | 365/163 |
| 2010/0295012 A1 * | 11/2010 | Mikawa et al. | ................. | 257/4 |
| 2012/0106257 A1 * | 5/2012 | Shiino et al. | ............. | 365/185.19 |

FOREIGN PATENT DOCUMENTS

| | | |
|---|---|---|
| JP | 2005-522045 | 7/2005 |
| JP | 2005-222687 | 8/2005 |
| JP | 2006-99882 | 4/2006 |
| JP | 2006-344349 | 12/2006 |
| JP | 2007-26627 | 2/2007 |
| WO | WO 2006/134732 A1 | 12/2006 |
| WO | WO 2007/052426 A1 | 5/2007 |

OTHER PUBLICATIONS

U.S. Appl. No. 13/233,679, filed Sep. 15, 2011, Minemura, et al.
U.S. Appl. No. 13/234,796, filed Sep. 16, 2011, Takashima, et al.
Japanese Office Action issued Nov. 29, 2011 in patent application No. 2009-183699 (submitting English Translation only).

\* cited by examiner

*Primary Examiner* — Connie Yoha
(74) *Attorney, Agent, or Firm* — Oblon, Spivak, McClelland, Maier & Neustadt, L.L.P.

(57) ABSTRACT

A non-volatile semiconductor memory device according to an aspect of embodiments of the present invention includes a memory cell array including: multiple first wirings; multiple second wirings crossing the multiple first wirings; and multiple electrically rewritable memory cells respectively arranged at intersections of the first wirings and the second wirings, and each formed of a variable resistor which stores a resistance value as data in a non-volatile manner. The non-volatile semiconductor memory device according to an aspect of the embodiments of the present invention further includes a controller for selecting a given one of the memory cells, generating an erase pulse which is used for erasing data, and supplying the erase pulse to the selected memory cell. The erase pulse has a pulse width which is increased or decreased exponentially in accordance with an access path length to the selected memory cell.

3 Claims, 6 Drawing Sheets

NON-VOLATILE SEMICONDUCTOR MEMORY DEVICE INCLUDING MEMORY CELLS WITH A VARIABLE RESISTOR

This application is based upon and claims the benefit of priority from Japanese Patent Application No. 2009-183699, filed Aug. 6, 2009; the entire contents of which are incorporated herein by reference.

FIELD

Embodiment described herein relate generally to a non-volatile semiconductor memory device with memory cells that are provided with a variable resistor and are operative to store data by changing the resistance of the variable resistor.

BACKGROUND

As an electrically rewritable non-volatile memory, a flash memory is heretofore known in which memory cells each having a floating gate structure are NAND-connected or NOR-connected to form a memory cell array. Moreover, a ferroelectric memory is known as a non-volatile memory which enables high-speed random access.

Meanwhile, a resistance varying memory using a variable resistor for a memory cell has been proposed as a technique to achieve further miniaturization of memory cells. Known examples of the variable resistor include: a phase-change memory element which causes a resistance value to change according to a state change of a chalcogenide compound between a crystalline state and an amorphous state; a MRAM element which uses resistive changes induced by the tunnel magneto-resistance effect; a polymer ferroelectric RAM (PFRAM) memory element in which a conductive polymer is used for forming a resistor; and a ReRAM element which causes resistive changes by the application of electrical pulses (refer, for example, to Japanese Unexamined Patent Application Publication No. 2006-344349).

In the resistance varying memory, a memory cell can be formed by a series circuit of a Schottky diode and a resistance varying element instead of a transistor. Accordingly, the resistance varying memory is advantageous in its easy lamination and in enabling higher integration by designing it to have a three-dimensional structure (refer, for example, to Japanese Unexamined Patent Application Publication (Translation of PCT Application) No. 2005-522045).

However, in the case of the resistance varying memory, the wiring resistance in an access path to a memory cell is different from one memory cell to another, as in the case of the other non-volatile memories. This causes variation in data write/erase/read characteristics among the memory cells. As a technique to compensate this variation, there is a method of increasing the height of a pulse applied on each memory cell by the amount corresponding to the voltage drop due to the wiring resistance in the corresponding access path. However, in a data erase operation, in which a resistance varying element is changed from a low-resistance state to a high-resistance state, this method also has a problem. Because, if the pulse is applied on the memory cell for a long period of time, re-programming of data may occur in which the resistance varying element is switched to the low-resistance state again immediately after being switched from the low-resistance state to the high-resistance state once.

DETAILED DESCRIPTION

A non-volatile semiconductor memory device according to an aspect of embodiments of the present invention includes a memory cell array including: multiple first wirings; multiple second wirings crossing the multiple first wirings; and multiple electrically rewritable memory cells respectively arranged at intersections of the first wirings and the second wirings, and each formed of a variable resistor which stores a resistance value as data in a non-volatile manner. The non-volatile semiconductor memory device according to an aspect of the embodiments of the present invention further includes a controller for selecting a given one of the memory cells, generating an erase pulse which is used for erasing data, and supplying the erase pulse to the selected memory cell. The erase pulse has a pulse width of which is increased or decreased exponentially in accordance with an access path length to the selected memory cell Hereinafter, embodiments of the non-volatile semiconductor memory device according to the present invention are described in detail with reference to the drawings.

[First Embodiment]

Figure 1:
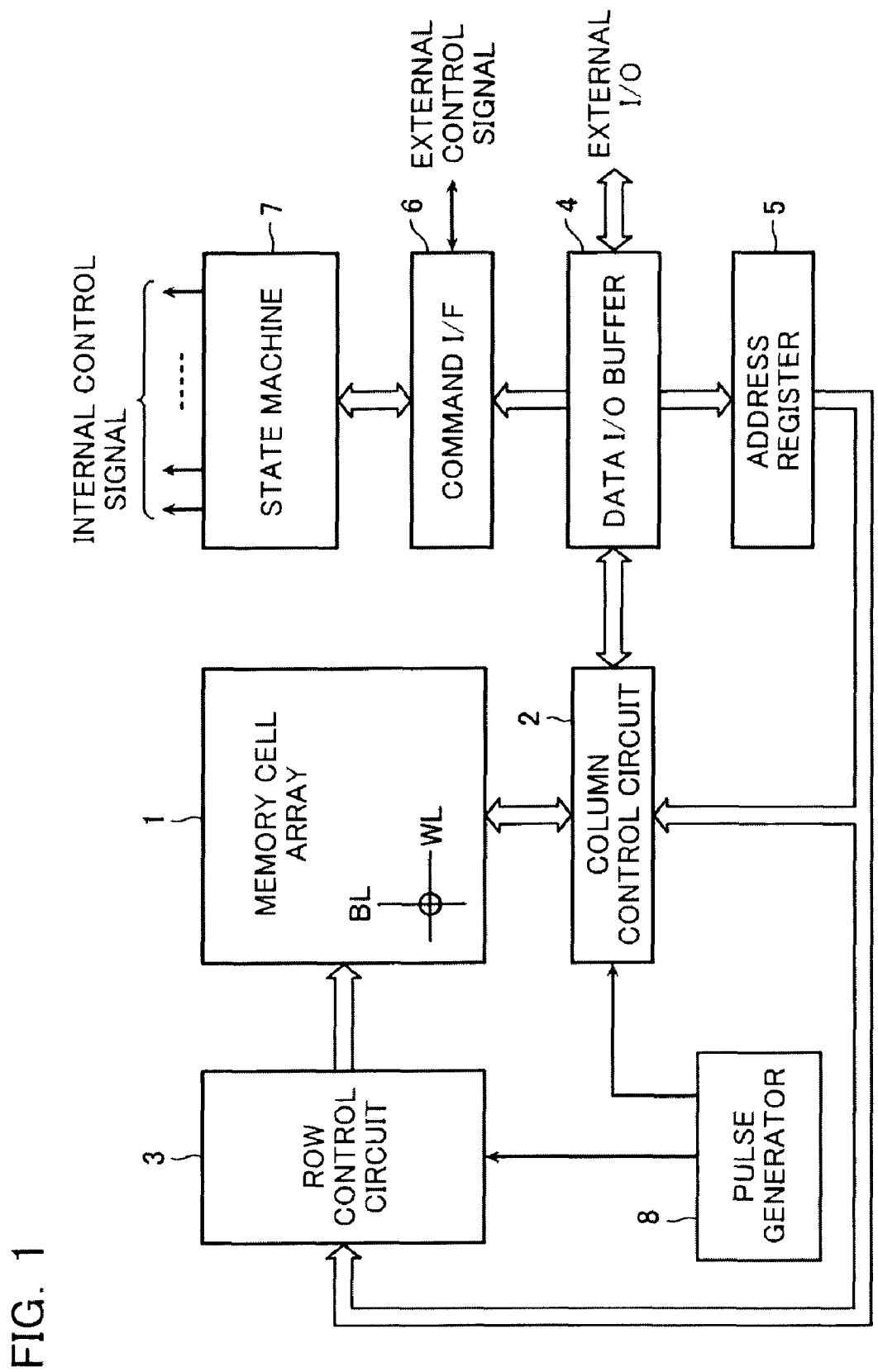
FIG. 1 is a block diagram of a non-volatile memory according to a first embodiment of the present invention.

FIG. 1 is a block diagram of a non-volatile memory according to a first embodiment of the present invention.

The non-volatile memory includes a memory cell array 1 having memory cells arranged in a matrix, the memory cells using later-described ReRAMs (variable resistors). The non-volatile memory also includes a column control circuit 2 in a position adjacent to the memory cell array 1 in a bit line BL direction, and a row control circuit 3 in a position adjacent to the memory cell array 1 in a word line WL direction. The column control circuit 2 controls a bit line BL of the memory cell array 1 to erase data from a corresponding memory cell, write data to the memory cell, and read data from the memory cell. The row control circuit 3 selects a word line WL of the memory cell array 1 and applies a voltage required to erase data from a corresponding memory cell, write data to the memory cell, and read data from the memory cell.

A data I/O buffer 4 is connected to a not shown external host via an I/O line. The data I/O buffer 4 receives write data and an erase command, outputs read data, and receives address data and command data. The data I/O buffer 4 transmits received write data to the column control circuit 2, and receives read data from the column control circuit 2 and outputs the received data to the outside. An address supplied from the outside to the data I/O buffer 4 is transmitted to the column control circuit 2 and the row control circuit 3 via an address register 5. Meanwhile, a command supplied from the host to the data I/O buffer 4 is transmitted to a command interface 6. In response to an external control signal from the host, the command interface 6 determines whether data inputted to the data I/O buffer 4 is write data, a command, or an address. If the data is a command, the command interface 6 receives the data and transfers the data as a command signal to a state machine 7. The state machine 7 manages the entire semiconductor memory device, and performs management on reading, writing, erasing, data input/output, and the like in response to a command from the host. Moreover, the external host may receive status information managed by the state machine 7, and judge an operation result from the information. The status information is also used for performing control on writing and erasing.

Further, the state machine 7 controls a pulse generator 8. The control enables the pulse generator 8 to output pulses of any voltage at any timing. To be more specific, the state machine 7 receives an address given from the outside via the address register 5, determines which memory cell of the memory cell array 1 is accessed with the address, and controls the width of each pulse from the pulse generator 8 according to the magnitude of the wiring resistance in an access path to the memory cell. Here, the pulses thus formed can be transferred to any wirings selected by the column control circuit 2 and the row control circuit 3.

Here, the peripheral circuit elements other than the memory cell array 1 can be formed on a silicon substrate right under the memory cell array 1. This allows making the chip area of the semiconductor memory device almost equal to the area of the memory cell array 1.

Figure 2:
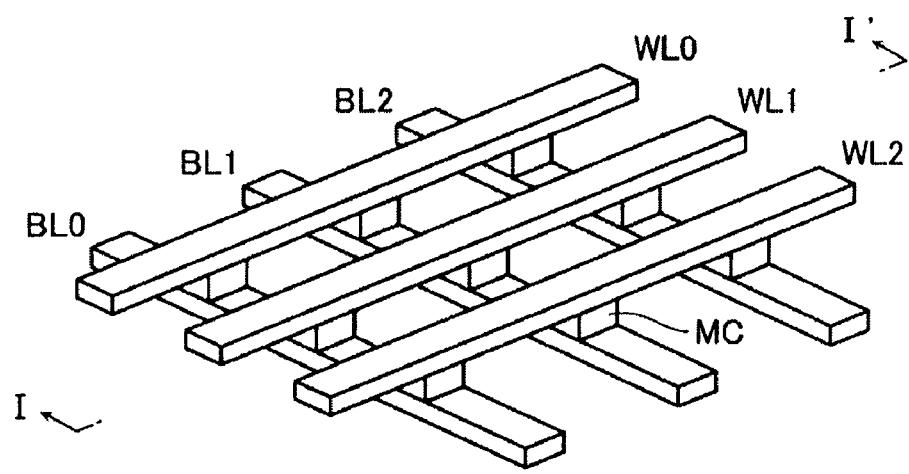
FIG. 2 is a perspective view of a part of a memory cell array of the non-volatile memory according to the first embodiment.
Figure 3:
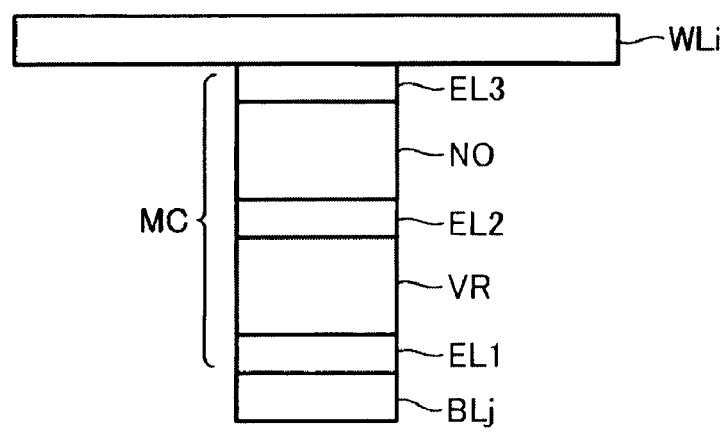
FIG. 3 is a cross-sectional view of one memory cell taken along the line I-I' in FIG. 2 and seen in an arrow direction.

FIG. 2 is a perspective view of a part of the memory cell array 1. FIG. 3 is a cross-sectional view of one memory cell taken along the line I-I' in FIG. 2 and seen in an arrow direction.

Bit lines BL0 to BL2 are arranged in parallel as multiple first wirings, and word lines WL0 to WL2 are arranged in parallel as multiple second wirings in a way to cross the bit lines. A memory cell MC is arranged at each intersection of these lines to be sandwiched therebetween. The bit lines BL and the word lines WL are preferably made of a material resistant to heat and having a low resistance value, such as W, WSi, NiSi, or CoSi.

As shown in FIG. 3, the memory cell MC comprises a serial connection circuit of a variable resistor VR and a non-ohmic element NO.

The variable resistor VR is a resistor whose resistance value is variable through current, heat, chemical energy, or the like in response to voltage application. The variable resistor VR has electrodes EL2 and EL1 which are respectively arranged on top and bottom thereof and function as barrier metal and bonding layers. Examples of a material used for the electrodes include Pt, Au, Ag, TiAlN, SrRuO, Ru, RuN, Ir, Co, Ti, TiN, TaN, LaNiO, Al, PtIrO$_x$, PtRhO$_x$, and Rh/TaAlN. A metal film enabling uniform orientation may also be inserted. Further, a buffer layer, a barrier metal layer, a bonding layer, and the like may be additionally inserted.

As the variable resistor VR, a resistor can be used which is made of a complex compound containing cations being a transition element and whose resistance value is changed by the movement of cations (ReRAM).

Figure 4:
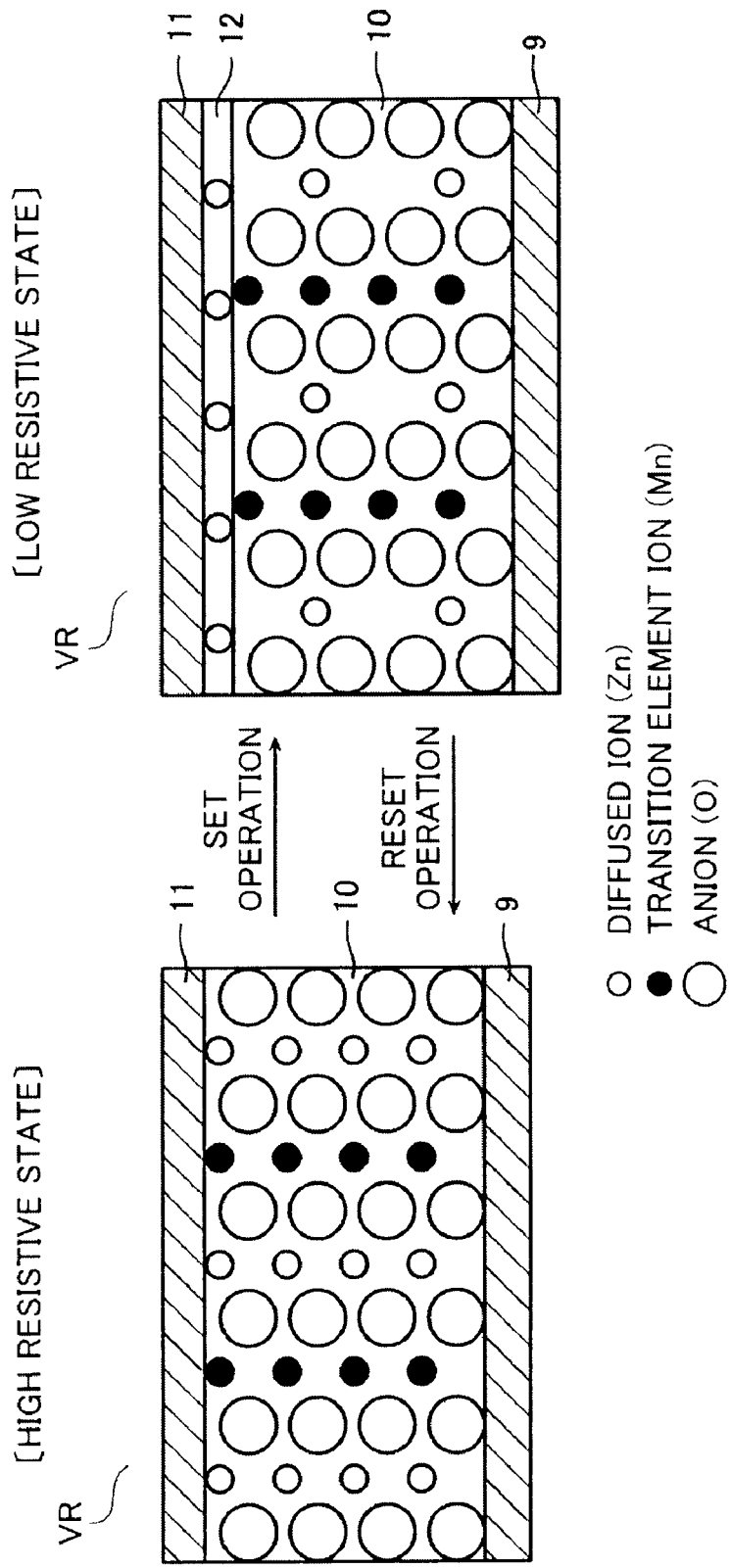
FIG. 4 is a schematic cross-sectional view showing an example of a variable resistor in the first embodiment.

FIG. 4 is a view showing an example of the variable resistor VR. The variable resistor VR shown in FIG. 4 is formed by arranging a recording layer 10 between electrode layers 9 and 11. The recording layer 10 is formed of a complex compound including at least two kinds of cationic elements. At least one kind of the cationic elements is a transition element having a d orbital incompletely filled with electrons. Moreover, the shortest distance between adjacent cationic elements is 0.32 nm or smaller. FIG. 4 shows the example of the case where ZnMnO is used as the recording layer 10. In the recording layer 10, a small white circle represents a diffuse ion (Zn), a large white circle represents an anion (o), and a small black circle represents a transition element ion (Mn). Initially, the recording layer 10 is in the high-resistance state. When a negative voltage is applied on the electrode layer 11 side with the electrode layer 9 set at a fixed potential, the diffuse ions in the recording layer 10 are partially moved toward the electrode layer 11, and the diffuse ions in the recording layer 10 are thus decreased relative to the anions. The diffuse ions moved toward the electrode layer 11 receive electrons from the electrode layer 11 and are deposited as metal, thereby forming a metal layer 12. Inside the recording layer 10, anions become excessive and this consequently increases the valence of the transition element ions inside the recording layer 10. As a result, the recording layer 10 becomes electrically conductive by the carrier injection, and thus the set operation is completed. For reproduction, a current may be flown which is minute enough not to cause a resistive change in the material forming the recording layer 10. The programmed state (low-resistance state) can be reset to the initial state (high-resistance state) by, for example, causing a large current to flow through the recording layer 10 for a sufficient time period to cause Joule heating and facilitate a redox reaction in the recording layer 10. Alternatively, the reset operation can also be performed by applying an electric field in an opposite direction to that in the set operation. Hereinafter, the reset operation is also called a "data erase operation."

In addition to the above, a transition metal compound such as HfO$_x$, HfSiO$_x$, MnO$_x$, MnAl$_x$O$_y$, ZnMnO$_x$, NiO$_x$, TiO$_x$, or WO$_x$ may be used as the variable resistor VR.

Figure 5:
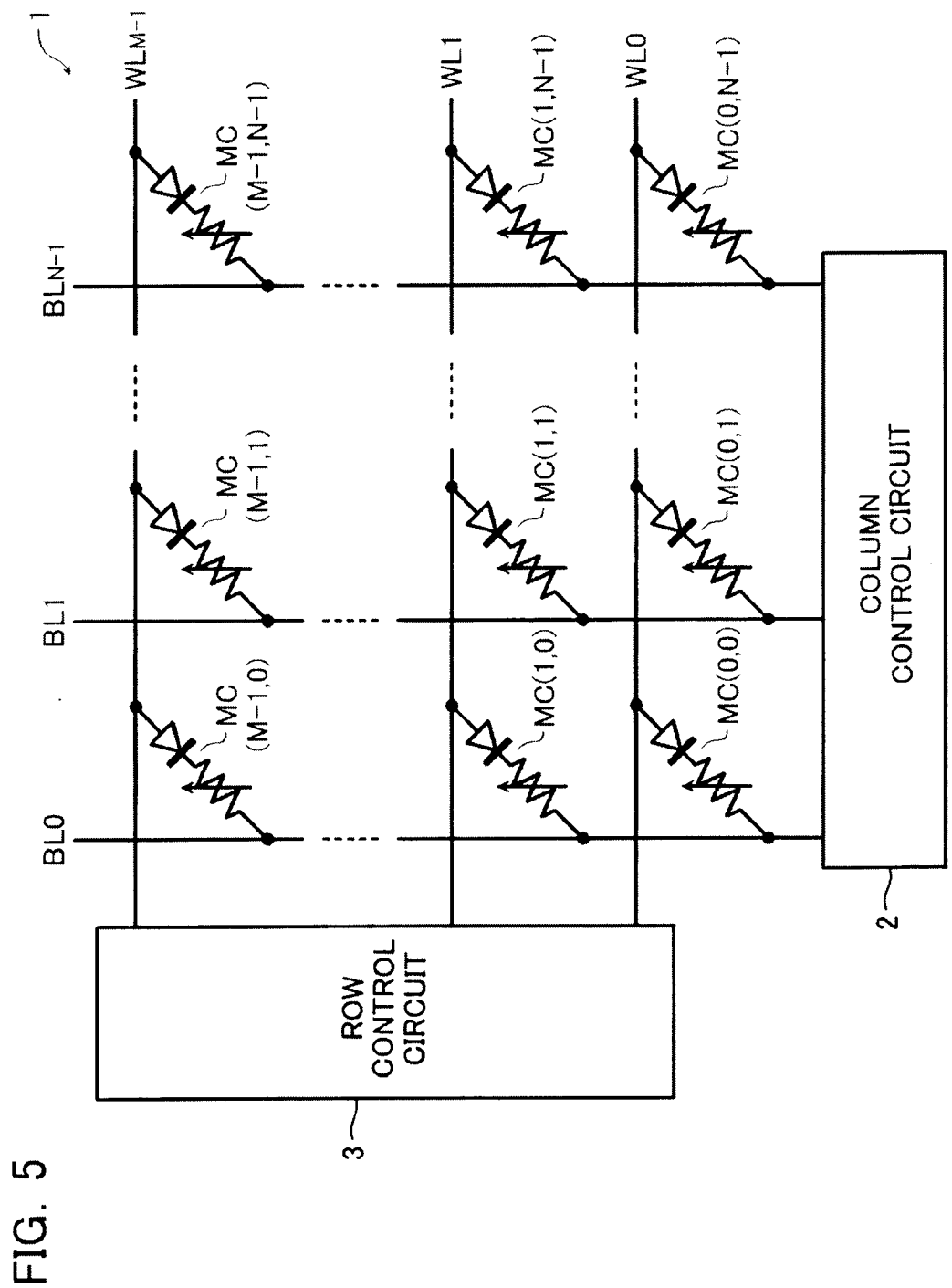
FIG. 5 is an equivalent circuit diagram of the memory cell array of the non-volatile memory according to the first embodiment.

FIG. 5 is an equivalent circuit diagram of the M×N (where M and N are each an integer of 2 or greater) memory cell array 1 of the non-volatile memory according to the first embodiment using the variable resistor VR shown in FIG. 4. The non-volatile memory includes the cell array 1 formed of: M word lines WL0 to WLM-1; N bit lines BL0 to BLN-1 crossing the word lines WL; and memory cells MC(0, 0) to MC(M-1, N-1) provided at respective intersections of the word lines WL and the bit lines BL. The non-volatile memory also includes: the column control circuit 2 connected to one ends, on the word line WL0 side, of the bit lines BL; and the row control circuit 3 connected to one ends, on the bit line BL0 side, of the word lines WL.

Next, description is given of a data erase operation for the memory cell array 1. Here, description is given of the data erase operation for the memory cell MC(1, 1) connected to the word line WL1 and the bit line BL1 at their intersection.

In this case, for example, the word line WL1 connected to the memory cell MC(1, 1) is supplied with an erase pulse of a height Vp which is required for data erasure, and the bit line BL1 is supplied with a ground voltage (0 V) of a height lower than the height Vp. As a result, the diode of the memory cell MC(1, 1) is forward biased. Accordingly, the resistance state of the corresponding variable resistor is switched from the low-resistance state to the high-resistance state, and the data erase operation is completed.

A ground voltage (0 V) is applied on the word lines WL connected to the memory cells MC other than the memory cell MC(1, 1), and a voltage pulse of a height Vp is applied on the bit lines BL connected to the memory cells MC other than the memory cell MC(1, 1). As a result, the diodes of the memory cells MC other than the memory cell MC(1, 1) are reverse biased. Accordingly, no current flows through the corresponding variable resistors, and thus the resistance state is not changed in these resistors.

However, the wiring resistance exists in each of the word lines WL and bit lines BL. When a common erase pulse is applied on all the memory cells MC, the resistance state after the data erase operation varies from one memory cell MC to another due to the influence of voltage drop caused by the wiring resistance. If this variation is large, the following two problems may arise, for example. Specifically, in the memory cell MC(0, 0) which is the closest to the column control circuit 2 and the row control circuit 3 and suffers from the least voltage drop due to the wiring resistance, it is highly likely that the data write operation occurs again after the data erase operation due to an excessive supply of the erase pulse. On the other hand, in the memory cell MC(M−1, N−1) which is the farthest from the column control circuit 2 and the row control circuit 3 and suffers from the largest voltage drop due to the wiring resistance, it is highly likely that the data erase operation fails to be completed due to an insufficient supply of the erase pulse.

In the following description, a path from the row control circuit 3 to the column control circuit 2 through the word line WLm (m=0 to M-1), the memory cell MC(m, n) (n=0 to N−1), and the bit line BLn is also called an "access path." Further, the length of the access path, which is defined using a distance between adjacent word lines WL and a distance between adjacent bit lines BL as its units, is also called an "access path length." In this case, the access path length of the memory cell MC(m, n) is m+n.

Figure 6:
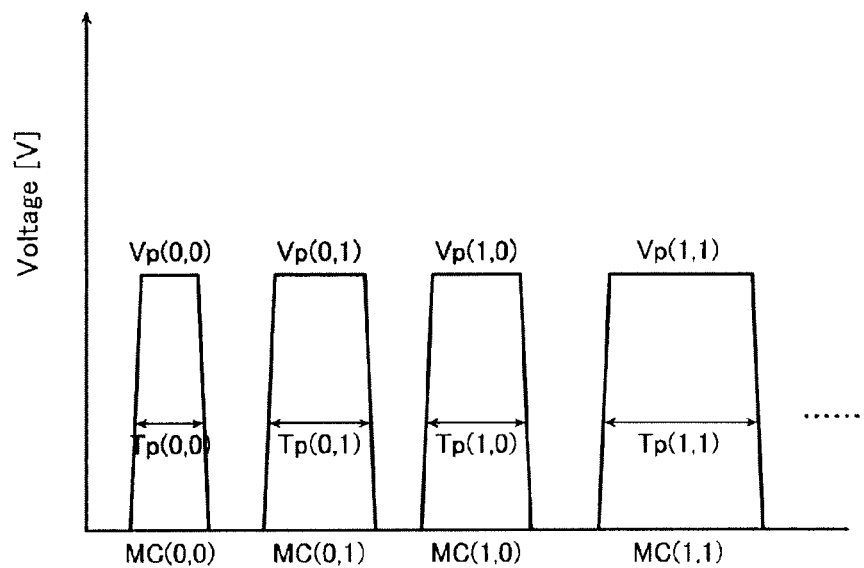
FIG. 6 shows waveforms of erase pulses which are generated by control circuits in a data erase operation for the memory cells in the first embodiment.

To cope with the above problems, in the first embodiment, various erase pulses different in pulse width are supplied to correspond to distances from the column control circuit 2 and the row control circuit 3. FIG. 6 is a diagram showing an example of erase pulses for the respective memory cells MC in the data erase operation of the first embodiment.

As shown in FIG. 6, an erase pulse to be generated is constant in height Vp irrespective of the position of the selected memory cell MC, but different in pulse width Tp according to the position of the memory cell MC. To be more specific, an erase pulse of the smallest pulse width Tp(0, 0) is generated in the data erase operation for the memory cell MC(0, 0) having the smallest access path length. The larger the access path length is, the larger the pulse width Tp of an erase pulse to be generated is. Accordingly, of the memory cells MC shown in FIG. 6, an erase pulse Tp(1,1) with the largest pulse width is generated in the data erase operation for the memory cell MC(1, 1) with the largest access path length. The pulse width Tp of the erase pulse is determined according to the wiring resistance in the corresponding access path. For this reason, erase pulses of the substantially same pulse widths Tp(0, 1) and Tp(1, 0) are generated in the data erase operation for the memory cells MC(0, 1) and MC(1, 0) which are in different positions but have the substantially same access path length and the substantially same wiring resistance.

Next, detailed description is given of the relationship between the access path length of a memory cell MC and the pulse width Tp of an erase pulse generated in the data erase operation for the memory cell MC.

Figure 7:
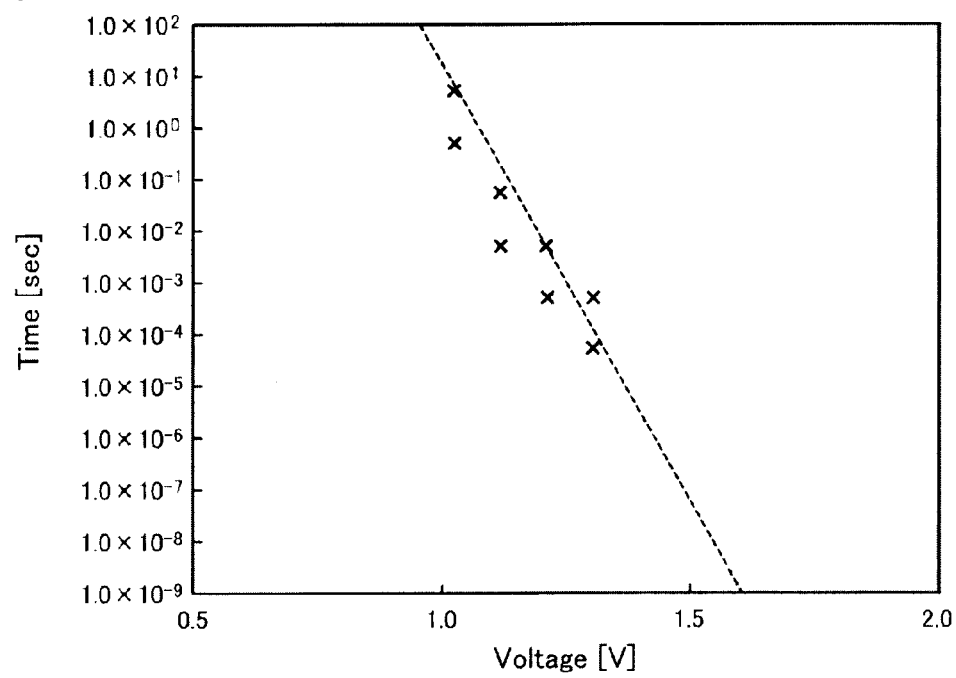
FIG. 7 is a graph showing the relationship between the height of a voltage required for erasing data of a memory cell and an application time period of the voltage, according to the first embodiment.

FIG. 7 is a graph showing the relationship between an erase voltage Ve required for erasing data of a memory cell MC and its application time period Te. Here, hafnium oxide is used for the recording layer 10 of the variable resistor, and titanium nitride is used for the electrodes 9 and 11 thereof.

It is understood from FIG. 7 that the smaller the erase voltage Ve is, the more application time period Te is required for data erasure. The relationship is generally represented by the following formula (1):

[Mathematical Formula 1]

$$\mathrm{Log}(Te) = B_1 - k_1 \times Ve \quad (1)$$

where $B_1$ and $k_1$ are constants determined according to the material of the variable resistor.

Note that, it is considered from FIG. 7 that the data erase operation (reset operation) of the variable resistor is in accordance with Arrhenius Model shown in the following formula (2):

[Mathematical Formula 2]

$$K = A \times e^{E/kT} \quad (2)$$

where K indicates a reaction rate constant, k indicates a Boltzmann's constant, T indicates a temperature (Kelvin), E indicates activation energy, and A indicates a constant.

Meanwhile, the larger the access path length is, the larger the wiring resistance is, and accordingly the larger the voltage drop in the access path is. Thus, a difference between the wiring resistance in the access path for the memory cell MC(m, n) and the wiring resistance in the access path for the memory cell MC(0, 0) can be represented by R(m+n), the memory cells each being connected to the word line WLm and the bit line BLn at their intersection. Here, R is a constant determined by the product of the sheet resistance of the corresponding word line WL and bit line BL, and the length of a wire between adjacent memory cells MC. When a current value required for the reset operation (data erase operation) for the variable resistor is defined as Ie and a voltage to be applied on the memory cell MC(0, 0) in the application of a predetermined erase voltage is defined as V0, a voltage Vmn to be applied on the memory cell MC(m, n) can be represented by the following formula (3):

[Mathematical Formula 3]

$$Vmn = V0 - Ie \times R(m+n) = V0 - k_2(m+n) \quad (3)$$

where $k_2$ is a constant ($Ie \times R$).

Accordingly, the time period Te required for erasing data of the memory cell MC(m, n) can be represented by the following formula (4) from the formulae (1) and (3):

[Mathematical Formula 4]

$$\mathrm{Log}(Te) = B_1 - k_1(V0 - k_2(m+n)) = B_2 + k_3(m+n) \quad (4)$$

where $B_2$ is a constant ($B - k_1 \times V0$) and $k_3$ is a constant ($k_1 \times k_2$).

In view of the above, it can be said that the pulse width Tp(m, n) of an erase pulse for the memory cell MC(m, n) is preferably set in accordance with the following formula (5):

[Mathematical Formula 5]

$$\mathrm{Log}(Tp(m,n)) = B + k'(m+n) \quad (5).$$

Figure 8:
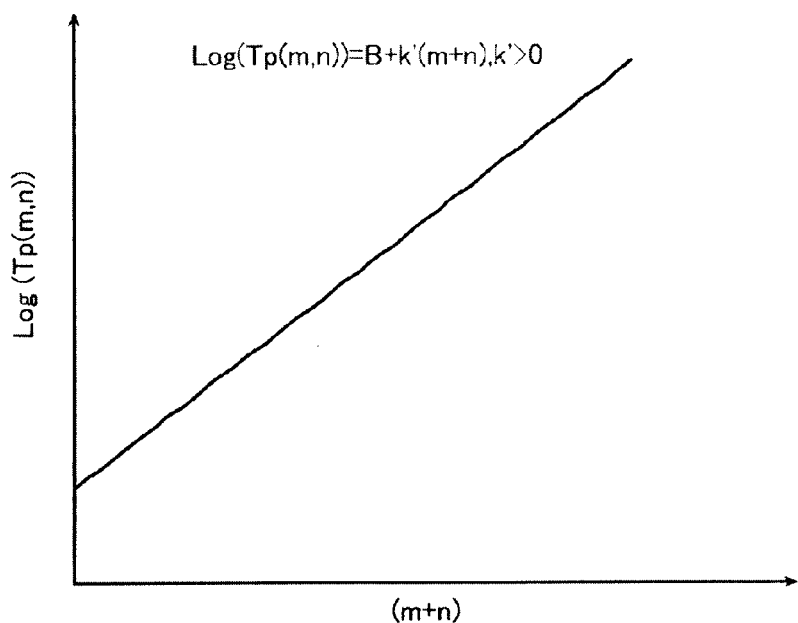
FIG. 8 is a graph showing the relationship between the position of a selected memory cell and the pulse width of an erase pulse generated by the control circuits, according to the first embodiment.

FIG. 8 is a graph illustrating the formula (5).

As has been described, according to the first embodiment, the pulse width Tp(m, n) of the erase pulse is changed according to the position of the memory cell MC(m, n) so that the formula (5) may be satisfied. Thereby, the voltage drop caused by the wiring resistance can be compensated. This allows providing a non-volatile semiconductor memory device capable of suppressing variation in data erase characteristics among memory cells MC without increasing the risk of re-programming of data.

[Second Embodiment]

In a non-volatile memory according to a second embodiment of the present invention, the pulse width of an erase pulse is increased or decreased in a stepwise manner.

Figure 9:
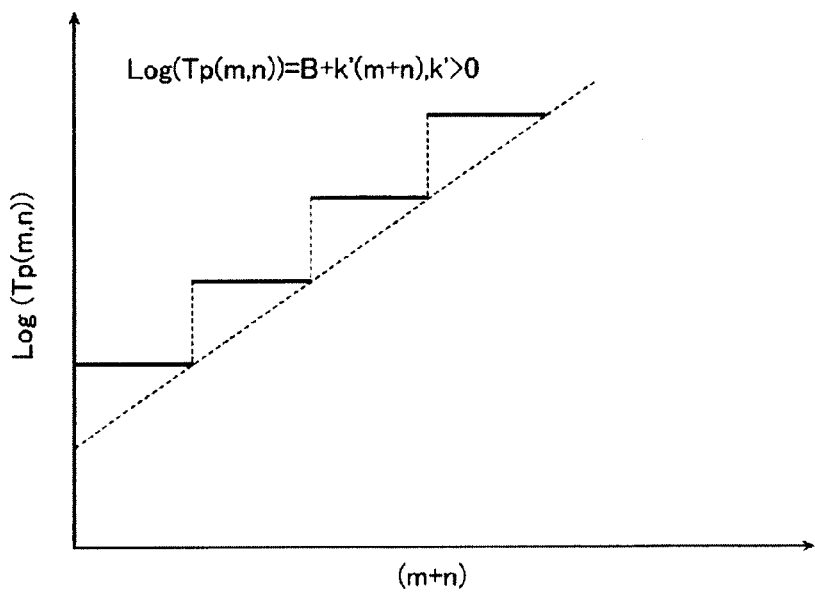
FIG. 9 is a graph showing the relationship between the position of a selected memory cell and the pulse width of an erase pulse generated by the control circuits, according to a second embodiment.

FIG. 9 is a graph showing the relationship between the access path length for the memory cell MC(m, n) and the pulse width Tp of an erase pulse supplied to the memory cell MC(m, n), according to the second embodiment. Here, dotted lines in FIG. 9 indicate the formula Log(Tp(m, n))=B+k' (m+n), and indicate the pulse width Tp of the erase pulse at least required for erasing data of the memory cell MC(m, n).

In the second embodiment, the pulse width Tp of an erase pulse is increased in a stepwise manner to correspond to an increase in the access path length. This means that an erase pulse of a single pulse width Tp is supplied to a group of multiple memory cells MC (hereinafter called a "memory cell group") having access path lengths in a certain range. By increasing or decreasing in a stepwise manner the pulse width Tp of the erase pulse as described above, a process to determine the pulse width can be made simpler than that in the first embodiment.

Here, the pulse width Tp of the erase pulse needs to be large enough to erase data of a memory cell MC, having the largest access path length, of the memory cell group. This prevents a data erase error due to an insufficient supply of the erase pulse. However, if the pulse width Tp of the erase pulse is excessively large, re-programming of data is likely to occur in a memory cell MC, having a relatively small access path length, of the memory cell group.

In light of the above, it is preferable to set the pulse width Tp of the erase pulse to the smallest value which allows erasing data of the memory cell MC, having the largest access path length, of the memory cell group, and to set the number of steps for the pulse width Tp so as not to cause re-programming of data in a memory cell MC, having the smallest access path length, of the memory cell group. Next, a desirable pulse width Tp is described by taking a specific memory cell array as an example. The memory cell array assumed here is of 22-nm generation, 1K×8K in size, and uses hafnium oxide for the recording layer 10 of the variable resistor as in the case of FIG. 7.

In this case, a difference between the voltage drop caused in the access path for the memory cell MC(M−1, N−1) having the largest access path length and that for the memory cell MC(0, 0) having the smallest access path length is approximately 0.14 V. Note that, since a memory cell MC is obtained by a serial connection of a variable resistor and a diode, a voltage to be applied on the variable resistor is approximately half of a voltage to be applied on the entire memory cell MC. Hence, a difference between a voltage to be applied on the variable resistor of the memory cell MC(M−1, N−1) and a voltage to be applied on the variable resistor of the memory cell MC(0, 0) is approximately 0.07 V at a maximum.

Further, from FIG. 7, the relationship between an erase voltage Ve and its application time period Te can be represented by the following formula (6):

[Mathematical Formula 6]

$$\mathrm{Log}(Te)=B-11.68\times Ve \quad (6).$$

In other words, when Temax and Temin respectively indicate an application time period Te of an erase voltage at least required for erasing data of the memory cell MC(M−1, N−1) and an application time period Te of an erase voltage at least required for erasing data of the memory cell MC(0, 0), the following formula (7) is satisfied:

[Mathematical Formula 7]

$$\mathrm{Log}(Temax)-\mathrm{Log}(Temin)=11.68\times 0.07 \approx 0.8 \quad (7)$$

Consider here a case where only two kinds of pulse widths Tp are set, i.e., a small pulse width Tp1 and a large pulse width Tp2, to simplify a determination of an erase pulse. In this case, of the memory cell array: a memory cell group of memory cells MC each having an access path length equal or smaller than the half of the largest access path length may be supplied with an erase pulse of pulse width Tp1; a memory cell group of memory cells MC each having an access path length larger than the half of the largest access path length may be supplied with an erase pulse of pulse width Tp2. In order to complete the data erase operation for all the memory cells MC: pulse width Tp1 of the erase pulse needs to be equal to the application time period Te of an erase voltage at least required for erasing data of the memory cell MC having the largest access path length among the memory cell group supplied with the erase pulse of pulse width Tp1 pulse width Tp2 of the erase pulse needs to be equal to the application time period Te of an erase voltage at least required for erasing data of the memory cell MC(M−1, N−1) having the largest access path length among the memory cell group supplied with the erase pulse of pulse width Tp2. Here, a difference in voltage drop between these two memory cells MC is approximately 0.035 V which is half of 0.07 V. Thus, the relationship between the pulse widths Tp1 and Tp2 of an erase pulse can be represented by the following formula (8) from the formula (6):

[Mathematical Formula 8]

$$\mathrm{Log}(Tp2)-\mathrm{Log}(Tp1)=11.68\times 0.035 \approx 0.4 \quad (8)$$

In consideration of the above, the relationship between the pulse width Tp(0, 0) of an erase pulse for the memory cell MC(0, 0) and the pulse width Tp(M−1, N−1) of an erase pulse for the memory cell MC(M−1, N−1) preferably includes the following formula (9):

[Mathematical Formula 9]

$$\mathrm{Log}(Tp(M\text{-}1, N\text{-}1))=0.4+\mathrm{Log}(Tp(0,0)) \quad (9)$$

Note that, when S indicates the number of steps for the pulse width Tp of an erase pulse, the largest pulse width Tpmax and the smallest pulse width Tpmin of an erase pulse to be generated can be represented by the following formula (10):

[Mathematical Formula 10]

$$\mathrm{Log}(Tpmax)=0.8\times(S\text{-}1)/S+\mathrm{Log}(Tpmin) \quad (10)$$

As described above, the formula (10) is defined on the assumption that the memory cell array which is of 22-nm generation, 1K×8K in size, and uses hafnium oxide is used. Since 0.8, being a proportional constant, can be generally represented by a constant a, the formula (10) can be represented as the following formula (11) which is independent of the designing rule and memory cell array size:

[Mathematical Formula 11]

$$\mathrm{Log}(Tpmax)=a\times(S\text{-}1)/S+\mathrm{Log}(Tpmin) \quad (11)$$

As has been described, the second embodiment allows simplifying the control on the pulse width of an erase pulse as compared to that in the first embodiment. Even with the above configuration, the second embodiment allows reducing variation in data erase characteristics due to the voltage drop caused by the wiring resistance as compared to that seen in the conventional non-volatile memory in which a common erase pulse is supplied to all the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a memory cell array including
        a plurality of first wirings,
        a plurality of second wirings crossing the plurality of first wirings, and
        a plurality of memory cells that respectively includes a variable resistor made of a hafnium oxide-based material and a diode serially connected to the variable resistor, and arranged at intersections of the plurality of first wirings and the plurality of second wirings; and
    a controller operative to select a given one of the memory cells, to generate an erase pulse which is used for erasing data, and to supply the erase pulse to the selected memory cell,
    wherein the erase pulse has a pulse width which is increased or decreased exponentially in accordance with an access path length to the selected memory cell,
    the memory cell array is an equal or smaller than 22-nm generation memory cell array including equal or more than 1K×8K of the memory cells,
    the controller generates the erase pulse of a pulse width of a number of steps S (where S is an integer of not smaller than 2), and
    a relationship between a maximum value Tpmax of the pulse width of the erase pulse and a minimum value Tpmin thereof satisfies $\text{Log}(Tpmax) \geq 0.8 \times (S-1)/S + \text{Log}(Tpmin)$.

2. The non-volatile semiconductor memory device according to claim 1, wherein the controller increases or decreases the pulse width of the erase pulse in a stepwise manner.

3. The non-volatile semiconductor memory device according to claim 2, wherein the pulse width of the erase pulse is equal to a pulse width required for erasing data of a given one of the memory cells which has the largest access path length from the controller among the memory cells supplied with the erase pulse of the pulse width.

* * * * *